United States Patent
Wille et al.

(10) Patent No.: US 7,030,031 B2
(45) Date of Patent: Apr. 18, 2006

(54) METHOD FOR FORMING DAMASCENE STRUCTURE UTILIZING PLANARIZING MATERIAL COUPLED WITH DIFFUSION BARRIER MATERIAL

(75) Inventors: William C. Wille, Red Hook, NY (US); Daniel C. Edelstein, White Plains, NY (US); William J. Cote, Poughquag, NY (US); Peter E. Biolsi, New Windsor, NY (US); John Fritche, New Paltz, NY (US); Allan W. Upham, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 167 days.

(21) Appl. No.: 10/604,056

(22) Filed: Jun. 24, 2003

(65) Prior Publication Data

US 2004/0266201 A1   Dec. 30, 2004

(51) Int. Cl.
*H01L 21/302* (2006.01)

(52) U.S. Cl. ............. 438/725; 438/627; 438/636; 438/702; 438/719; 438/723; 438/724; 438/781; 216/19

(58) Field of Classification Search ............ 216/19; 438/622–627, 636–638, 694–703, 780, 781, 438/952
See application file for complete search history.

(56) References Cited

U.S. PATENT DOCUMENTS

| 5,883,006 | A | 3/1999 | Iba |
| 6,316,167 | B1 | 11/2001 | Angelopoulos et al. |
| 6,365,529 | B1 * | 4/2002 | Hussein et al. ............ 438/780 |
| 6,391,472 | B1 * | 5/2002 | Lamb et al. ............... 428/624 |
| 6,426,298 | B1 | 7/2002 | Chen et al. |
| 6,583,047 | B1 * | 6/2003 | Daniels et al. ............ 438/638 |
| 6,689,695 | B1 * | 2/2004 | Lui et al. .................. 438/700 |
| 6,720,256 | B1 * | 4/2004 | Wu et al. .................. 438/638 |
| 6,835,652 | B1 * | 12/2004 | Fujimoto ................... 438/636 |
| 6,878,615 | B1 * | 4/2005 | Tsai et al. ................. 438/618 |

(Continued)

FOREIGN PATENT DOCUMENTS

JP   2000208620 A   7/2000

OTHER PUBLICATIONS

Wolf et al., Silicon Processing for the VLSI Era, 1986, Lattice Press, vol. 1, pp. 182-183.*

(Continued)

*Primary Examiner*—Nadine G. Norton
*Assistant Examiner*—Eric B. Chen
(74) *Attorney, Agent, or Firm*—Lisa U. Jaklitsch

(57) ABSTRACT

This invention relates to the manufacture of dual damascene interconnect structures in integrated circuit devices. Specifically, a method is disclosed for forming a single or dual damascene structure in a low-k dielectric thin film utilizing a planarizing material and a diffusion barrier material. In a preferred dual damascene embodiment of this method, the vias are formed first in the dielectric material, then the planarizing material is deposited in the vias and on the dielectric material, and the barrier material is deposited on the planarizing material. The trenches are then formed lithographically in the imaging material, etched through the barrier material into the planarizing material, and the trench pattern is transferred to the dielectric material. During and following the course of these etch steps, the imaging, barrier and planarizing materials are removed. The resultant dual damascene structure may then be metallized. With this method, the problem of photoresist poisoning by the interlevel dielectric material is alleviated.

94 Claims, 3 Drawing Sheets

U.S. PATENT DOCUMENTS

| | | |
|---|---|---|
| 2001/0036748 A1 | 11/2001 | Rutter, Jr. et al. |
| 2002/0012876 A1 | 1/2002 | Angelopoulos et al. |
| 2002/0058204 A1 | 5/2002 | Khojasteh et al. |
| 2002/0164877 A1 | 11/2002 | Catabay et al. |
| 2004/0018721 A1* | 1/2004 | Kim et al. .................. 438/637 |
| 2004/0087164 A1* | 5/2004 | Bao et al. .................. 438/694 |

OTHER PUBLICATIONS

Wolf, Silicon Processing for the VLSI Era, 2002, Lattice Press, vol. 4, pp. 689-690.*

Wolf et al., Silicon Processing for the VLSI Era, 1986, Lattice Press, vol. 1, p. 191.*

Wolf, Silicon Processing for the VLSI Era, 2002, Lattice Press, vol. 4, p. 720.*

Wolf, Silicon Processing for the VLSI Era, 2002, Lattice Press, vol. 4, p. 680.*

"A High Performance 0.13 um C pper BEOL Techn logy with Low-K Dielectric" R.D. Goldblatt, et al. Proceedings of the IEEE 2000 Internationational Interconnect Technology Conference, Jun., 5-7, 2000, pp .261-263.

"A Manufacturable Copper/Low-k SiOC/SiCN Process Technology for 90nm-node High Performance eDRAM", K. Higashi, et al., Proceedings of the IEEE 2002 International Interconnect Technology Conference, Jun. 3-5, 2002, pp. 15-17.

"A High Resolution 248 nm Bilayer Resist" Qinghuang Lin, et al., Proc. SPIE—Int. Soc. Opt. Eng. (USA), vol. 3678, pt. 1-2, pp. 241-250.

"Surface treatment validation of inorganic BARC on 0.25 um Non Volatile Memory technology", Y. Trouilleret al. Microelectronic Engineering 46 (1999), pp. 47-50.

"Effects of Crosslinking Agent on Lithographic Performance of Negative-Tone Resists Based on Poly (p-hydroxystyrene)", Qinghuang Lin, et al. Proc. SPIE—Int. Soc. Opt. Eng. (USA), vol. 3049, pp. 974-987.

U.S. Appl. No. 09/256,034, dated Feb. 23, 1999, Inventors M. Angelopoulos, et al. Entitled Multilayered Resist System Using Tuned Polymer Films as Underlayers and Methods of Fabrication Thereof.

* cited by examiner

METHOD FOR FORMING DAMASCENE STRUCTURE UTILIZING PLANARIZING MATERIAL COUPLED WITH DIFFUSION BARRIER MATERIAL

BACKGROUND OF INVENTION

This invention relates generally to the manufacture of integrated circuit devices, and more specifically, to the manufacture of single and dual damascene interconnect structures in integrated circuit devices.

Several basic methods for forming a dual damascene structure have been developed. These include the via-first approach, the line-first approach, and various hardmask schemes. All of these methods are fraught with problems.

With the via-first approach, the use of photoresist layers on dielectric layers often results in "poisoning" of the line imaging layer which is done after vias are fully or partially etched into the dielectric. This is the case even when bottom anti-reflective coatings are used to fill the vias temporarily, so as to provide a planar surface for the line imaging layer. The source of this poisoning is not clearly understood, but it is thought to be due to absorption and/or generation and liberation of amine compounds from the insulator, as a result of its finite permeability and the use of $N_2$ and $H_2$ process gases in the films below, as well as in the etching and stripping of patterns prior to applying the photoresist where the poisoning is observed. The poisoning problem appears to be much worse when the dielectric layer is a low-k insulator applied using chemical vapor deposition (CVD), as compared to silicate glass dielectric layers. This is thought to be a result of the increased permeability of low-k insulators, the use of $N_2O$ as a carrier gas in some deposition recipes, and the common use of reducing chemistries such as $N_2$ and $H_2$ for stripping prior lithographic patterns.

Attempts to solve the poisoning problems have been incomplete. One attempt is to use a resist material that is less sensitive to poisoning. However, such resist materials compromise imaging resolution and decrease lithographic process window. Another attempt is to modify the dielectric material so that it causes less poisoning. For example, in U.S. Pat. No. 6,147,009 to Grill et al., the use of $N_2O$ as an oxidizing carrier gas is avoided by using a siloxane-based precursor and He gas to make low-k SiCOH films, thereby eliminating a source of nitrogen in the as-deposited film. This may prevent poisoning of a first photoresist material on the blanket SiCOH film, but after the pattern is etched into the SiCOH film and the resist is stripped, amines may still be generated and may poison a subsequent photoresist patterning step such as would be required for dual damascene interconnects. In another example, U.S. Published Application No. 2001/0036748 by Rutter, Jr. et al. describes a method to eliminate poisoning of photoresist by pretreating the low-k material with acidic compounds. However, such modifications may adversely affect the dielectric constant and other characteristics of the insulating materials. Also, certain underlying dielectric materials such as dielectric barrier caps on underlying Cu levels preferably contain nitrogen and hydrogen, and can be a source of poisoning that might not be easily remedied. Removing the nitrogen compromises the barrier properties, and removing the hydrogen raises the dielectric constant to unacceptable levels.

An example of a solution to line resist poisoning in a via-first dual-damascene approach is disclosed in K. Higashi et al., "A manufacturable Copper/Low-k SiOC/SiCN Process Technology for 90 nm-node High Performance eDRAM," Proc. of IEEE 2002 IITC, June 2002, pp. 15–17. Their practical solution required modifying the resist itself, limiting the polish stop and etch stop (Cu barrier cap) layers to nitrogen-free films, and eliminating use of nitrogen in etch and dielectric deposition chemistries. Even when a spin-on glass (SOG) layer was added between the planarizing and imaging layers (presumably for resist budget during etch), poisoning still occurred through this SOG layer.

Another approach with partial success is to deposit a barrier material after via etch. In this approach, the via is lined with a very thin layer of a barrier material such as TEOS or silane $SiO_2$, thereby encapsulating the poisoning source. The liner material must have excellent conformality. Since it is difficult to deposit materials in high-aspect ratio vias, this approach may not be extendable to future technologies. Defects in thin regions of this liner may allow poisoning gases to pass through, and even with low statistical occurrence may cause an unacceptable level of defective patterns in the line imaging layer.

Another approach that can successfully eliminate poisoning is through the application of multilayer hardmask films such as $SiO_2$, $Si_3N_4$, and metal nitrides such as TaN. This concept was first described in U.S. Pat. No. 6,140,226 to Grill et al., and was used successfully by R. D. Goldblatt et al. ("A High Performance 0.13 Âµm Copper BEOL Technology with Low-k Dielectric," Proceedings of the IEEE 2000 International Interconnect Technology Conference, pp.261–263) to pattern SiLK™ low-k polyarylene ether dielectric.(SiLK™ is a registered trademark of the Dow Chemical Company.) These methods are more complex and can be difficult for RIE manufacturing, because the RIE must be able to etch the dielectric with high selectively to the hardmask materials. That in turn may constrain the conditions under which the RIE may operate, and hence may compromise the ability to achieve the desired patterning control in the dielectric film. In the case of non-silicon containing organic polymers such as SILK™, this is not as difficult to achieve and may be the preferred approach. However, in the case of Si-containing dielectric materials such as SICOH, it is difficult to obtain high etch selectivity to any common hardmask materials, including metal nitrides. It becomes necessary to modify the conventional RIE chemistries or thicken the hardmask layers to the point where SiCOH pattern integrity is lost.

The line-first approach suffers from the difficulty of printing vias inside lines, especially at small dimensions. The reason for this difficulty is that the via imaging layer must planarize above a variety of line trench patterns at different pattern densities, leading to variation in this imaging layer thickness in various structures. It becomes difficult or impossible to define a photolithographic dose and focus process window that can image simultaneously all vias in all line pattern situations. As the via becomes ever smaller in size, it becomes ever more difficult to expose and develop out a via image through the extra thickness of resist that fills in, and becomes planar over, the line structure. Moreover, resist poisoning may continue to be a problem with this approach, as the already-etched line trenches expose the low-k dielectric to the via imaging layer, allowing amines, if present, to and poison this imaging layer.

Photoresist poisoning is a problem well known in the industry. Others skilled in the art have been unsuccessful in attempts to produce a barrier layer which prevents poisoning but does not damage planarizing material during its deposition. Some have therefore abandoned the via-first method, and are typically using hardmask schemes to circumvent poisoning. For example, the methods described in U.S. Pat. No. 6,316,167 and U.S. Published Application No. 2002/

0012876 by Angelopoulos et al., the disclosures of which are incorporated herein by reference, use a vapor deposited layer (R:C:H:X) as a multifunctional layer: planarization layer, arc layer, and hardmask layer. The vapor deposited film (R:C:H:X) is said to be compatible with resist, and therefore does not cause poisoning. The vapor deposited layer (R:C: H:X) becomes a permanent film on the device, which necessitates the additional requirement that the layer must also be a low-k material if it is to be used in state of the art devices. It is believed to be ever more difficult to find a material that meets all these requirements. There is currently not a known strip process for this material that would be compatible with patterned low-k dielectrics. Care must be used when selecting films to meet all of these requirements. For example, it has been discovered that some R:C:H:X films prevent poisoning while others do not, depending on the exact nature of the film.

In general, circumventing the phenomenon of resist poisoning has placed significant constraints on other elements in the multilevel damascene integration, especially for low-k insulators, that were not the case in previous generations; these constraints are not desired and represent disadvantages. As in the Higashi et al. paper, limitations are placed on choices that do not result in poisoning for the Cu barrier cap, the interlevel dielectric material itself, the etching and stripping chemistries used, the need for caps over the interlevel dielectric, and the choice of the resist imaging layer material itself. It is desirable to decouple the imaging layer from these other integration elements in a manner that does not constrain the choices in those elements, and yet by definition will prevent poisoning.

Thus, there remains a need in the art for a method of forming a dual damascene structure which does not suffer from the problems of photoresist poisoning.

SUMMARY OF INVENTION

The problems described above are solved by using the method of this invention. In general, this invention involves a method for forming an etched pattern on a semiconductor substrate. The method comprises the steps of depositing a thin film on the substrate; depositing a layer of planarizing material on the thin film; depositing a layer of barrier material on the layer of planarizing material; depositing at least one layer of imaging material on the layer of barrier material; forming at least one first pattern shape in the layers of imaging material, barrier material and planarizing material; removing the imaging material, either after or concurrently with forming the first pattern shape in the planarizing material; transferring the first pattern shape to the thin film; removing the barrier layer, either after or concurrently with transferring the first pattern shape to the thin film; and removing the planarizing material. The thin film is preferably a dielectric material, more preferably a low-k dielectric material. The planarizing material is preferably a poly (hydroxystyrene)-based system comprising poly(4-hydroxystyrene), 9-anthracenylmethylated poly(hydroxystyrene), tetrahydro-1,3,4,6-tetrakis (methoxymethyl)-imidazo[4,5-d] imidazole-2,5-(1H,3H)-dione, and p-nitrobenzyl tosylate (pNBT). The barrier material is preferably silicon dioxide deposited by plasma-enhanced chemical vapor deposition at a temperature of about 100Â° C. to about 225Â° C., more preferably about 150Â° C. The method may further comprise the steps of: depositing a layer of anti-reflective coating on the barrier material, prior to depositing the layer of imaging material; and removing the anti-reflective coating, either after or concurrently with forming the first pattern shape in the planarizing material. The method also may further comprise the step of filling the pattern shape with a conductive material such as copper, removing the imaging material, the barrier material and the planarizing material.

In a preferred embodiment, the invention involves a via-first method for forming a dual damascene interconnect structure on a semiconductor substrate comprising at least one patterned conductor. The method comprises the steps of: depositing a dielectric material on the substrate; forming at least one via in said dielectric material, such that at least one of the vias is positioned over the patterned conductor; depositing a layer of planarizing material on the dielectric material and in the via; depositing a layer of barrier material on the layer of planarizing material; depositing at least one layer of imaging material on the layer of barrier material; forming at least one trench in the layers of imaging material, barrier material and planarizing material, such that at least one of the trenches is positioned over the via; removing the imaging material, either after or concurrently with forming the trench in the planarizing material; transferring the at least one trench to the dielectric material, such that at least one of the trenches is positioned over the via; removing the barrier material, either after or concurrently with transferring the at least one trench to the dielectric material; and removing the planarizing material.

In an alternative embodiment, the invention involves a line-first method for forming a dual damascene interconnect structure on a semiconductor substrate comprising at least one patterned conductor. The method comprises the steps of: depositing a dielectric material on the substrate; forming at least one trench in the dielectric material, such that at least one of the trenches is positioned over the patterned conductor; depositing a layer of planarizing material on the dielectric material and in the trench; depositing a layer of barrier material on the layer of planarizing material; depositing at least one layer of imaging material on the layer of barrier material; forming at least one via in the layers of imaging material, barrier material and planarizing material, such that at least one of the vias is positioned over the trench and the patterned conductor; removing the imaging material, either after or concurrently with forming the via in the planarizing material; transferring the at least one via to the dielectric material, such that at least one of the vias is positioned over the trench and the patterned conductor; removing the barrier material, either after or concurrently with transferring the at least one via to the dielectric material; and removing the planarizing material.

BRIEF DESCRIPTION OF DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows, taken in conjunction with the accompanying drawings, in which:

DETAILED DESCRIPTION

The invention will now be described by reference to the accompanying figures. In the figures, various aspects of the structures have been shown and schematically represented in a simplified manner to more clearly describe and illustrate the invention. For example, the figures are not intended to be to scale. In addition, the vertical cross-sections of some of the various aspects of the structures are illustrated as being rectangular in shape. Those skilled in the art will appreciate, however, that with practical structures these aspects will most likely incorporate more tapered features. Moreover, the invention is not limited to constructions of any particular shape.

The problem of poisoning described above is solved by depositing a planarizing film on a patterned wafer and then depositing a barrier layer, preferably a low temperature oxide (LTO) film, on top of the planarizing film. Conventional lithographic patterning is performed on top of the LTO film. This invention achieves an advantage by planarizing the wafer, and by using LTO deposition conditions such that no damage is caused to the underlying planarizing film, while still producing an effective film that acts as a diffusion barrier to poisoning.

This invention is based on using the combination of a planarizing layer followed by a barrier layer which prevents photoresist poisoning. The use of a planarizing layer circumvents filling an etched pattern such as a deep aspect ratio trench. The preferred planarizing layer has superior planarization performance as well as superior thermal stability compared to many typical resist or arc materials used conventionally to fill vias during dual damascene patterning. These lead to improved manufacturability of fine patterns, as well as the ability to deposit an LTO film at temperatures suitable to achieve good barrier properties. The barrier layer deposited on top of the planarizing layer should be chemically stable, mechanically sound, relatively defect free, should not damage the planarizing layer, and should act as a barrier to photoresist poisoning.

Figure 1:
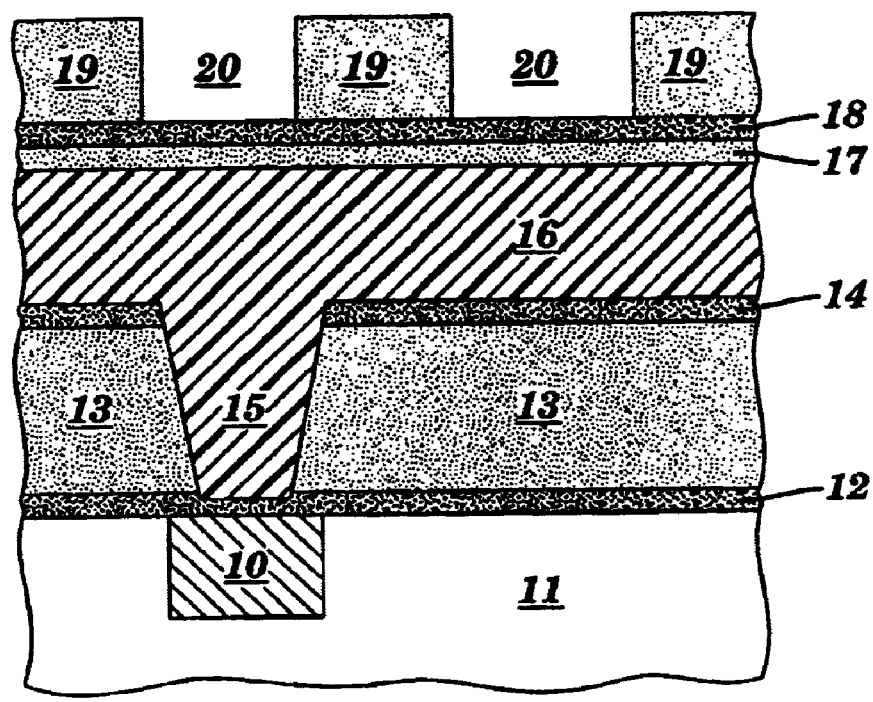
FIGS. 1–6 illustrate a preferred method of forming a dual damascene structure in accordance with the present invention.

A preferred embodiment of the method of this invention is shown in FIGS. 1–6, which illustrate use of the invention in a via-first dual damascene approach. In FIG. 1, the starting point of the method is a semiconductor substrate 11 having patterned conductors 10 embedded therein. Conductors 10 may be formed of any suitable conducting material, but are preferably formed of copper. A cap layer 12 and an interlevel dielectric (ILD) 13 are deposited on substrate 11 and conductors 10. The cap layer 12 may be formed of, for example, $SiN_x$ or SiCHN. The ILD 13 may be formed of any suitable dielectric material, but is preferably formed of a low-k material, i.e. a material having a dielectric constant less than 3.9, more preferably less than about 3.2. The low-k ILD 13 may be formed of, for example, SIOF (fluorosilicate glass, FSG, F-TEOS, etc.), SiCOH (organosilicate glass, OSG, carbon doped oxide, CDO, etc.) deposited by plasma enhanced chemical vapor deposition (PECVD), or any other suitable inorganic or organic low-k dielectric material. An optional cap 14 may be added above the low-k material 13; the cap 14 may be formed of a material such as silane or TEOS oxide, or SiC(N,H) low-k silicon carbide. Vias 15 are patterned using conventional patterning techniques, such as lithography and reactive ion etch (RIE)/strip. Poisoning is not generally encountered during patterning of via 15, either because the low-k film 13 does not yet contain amines, or because the cap 14 acts as a suitable barrier.

Then a planarizing layer 16 is applied. Planarizing layer 16 should fill vias 15 without voids and provide good resistance toward line RIE. Planarizing layer 16 also should be thick enough so that there is a sufficient thickness after RIE to define the line pattern. In addition, the planarization performance of this material should be adequate to limit deviations in surface topography over areas of differing via pattern density, otherwise subsequent high resolution lithographic performance might be compromised due to depth of focus limitations. The thickness of planarizing layer 16 may be expressed as a function of the via height. Specifically, a thickness in the range of about one half the via height to twice that of the via height is preferable. In a preferred embodiment, planarizing layer 16 has a thickness in the range of about 200 nm to about 700 nm for a via size of about 140 nm and a via height of about 600 nm. In a particularly preferred embodiment, planarizing layer 16 has a thickness of about 450 nm, wherein the thickness is about 0.75 that of the via height.

The planarizing material 16 is preferably a material such as that used for the underlayer in U.S. application Ser. No. 09/256,034, the disclosure of which is incorporated herein by reference. Specifically, the planarizing material is preferably a poly(hydroxystyrene) (PHS) based system which is a blend of two PHS polymers, a crosslinking agent, and a thermal acid generator (TAG). The preferred PHS polymers are poly(4-hydroxystyrene) and 9-anthracenylmethylated PHS. The preferred crosslinking agent is tetrahydro-1,3,4, 6-tetrakis(methoxymethyl)-imidazo[4,5-d]imidazole-2,5-(1H,3H)-dione, also known as "Powderlink." The preferred TAG is p-nitrobenzyl tosylate (pNBT). The ratio of the two PHS polymers poly(4-hydroxystyrene) and 9-anthracenyl-methylated PHS is preferably 3:7 in this system, but may be adjusted between the ranges of 0:10 to 10:0 to deliver the desired optical properties. The system also comprises about 10 wt % (based on the total polymer weight) of the crosslinking agent and about 5 wt % (based on the total polymer weight) of the TAG.

Other materials that may be used as the planarizing material 16 include polyarylsulfones such as the BARL material, polyhydroxystyrene based derivatives, an example being a copolymer of polyhydroxystyrene and polyhydroxystyrene reacted with anthracenemethanol that contains a cross-linker, and acid catalyst (thermal acid generator), polyimides, polyethers, in particular polyarylene ethers, polyarylenesulfides, polycarbonates, epoxies, epoxyacrylates, polyarylenes such as polyphenylenes, polyarylenevinylenes such as polyphenylenevinylenes, polyvinylcarbazole, cyclicolefins, and polyesters.

The preferred PHS-based planarizing material is preferably baked at a temperature of about 200Â° to about 250Â° C., more preferably at about 225Â° C.

Next, diffusion barrier layer 17 is deposited. In a preferred embodiment, barrier layer 17 is low-temperature silicon oxide (LTO) deposited by plasma-enhanced chemical vapor deposition (PECVD) at a temperature of about 100Â° C. to about 225Â° C., more preferably about 150Â° C., using silane and nitrous oxide as deposition sources. (Although $N_2O$ may be used, poisoning of subsequent imaging layers has been found not to result.) Alternatively, tetraethylorthosilicate (TEOS) and oxygen gas could be used. The thickness of barrier layer 17 is preferably between about 50 and 100 nm in order to act as an effective diffusion barrier.

Although LTO deposited by PECVD is preferred, other materials may be used for diffusion barrier layer 17, so long as their deposition temperature and stress are suitably low to avoid damaging the planarizing layer. For example, a metal or dielectric deposited by physical vapor deposition (sputtering or evaporation) or chemical vapor deposition may be used for diffusion barrier layer 17. Suitable materials include silicon, silicon nitride, silicon carbide, titanium nitride, and tantalum nitride. The material for layer 17 should be dense enough to perform as a barrier, and layer 17 should be thin enough (e.g., in the case of a metal) to be optically transmissive for lithographic alignment. The diffusion barrier layer may be formed of any material which effectively blocks the diffusion of impurities from the underlying insulator into the photoresist material, such as alkaline impurities which may diffuse into the photoresist and prevent the acid catalysis reaction. It is believed that alkaline impurities such as amines diffuse into the resist and prevent the acid catalysis reaction, and that the LTO layer should act as a barrier to these amines.

Figure 2:
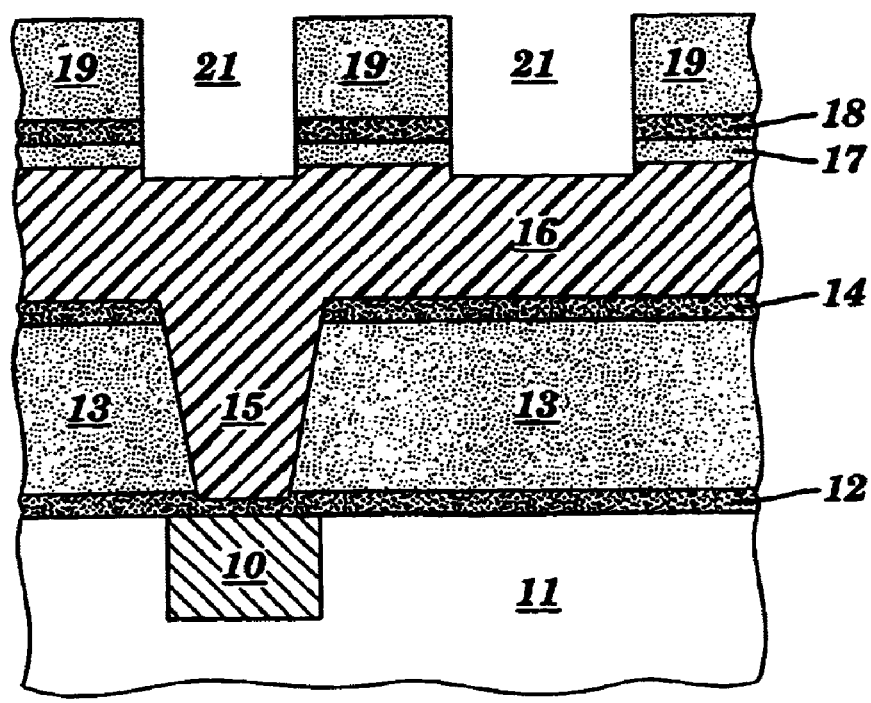
Figure 3:
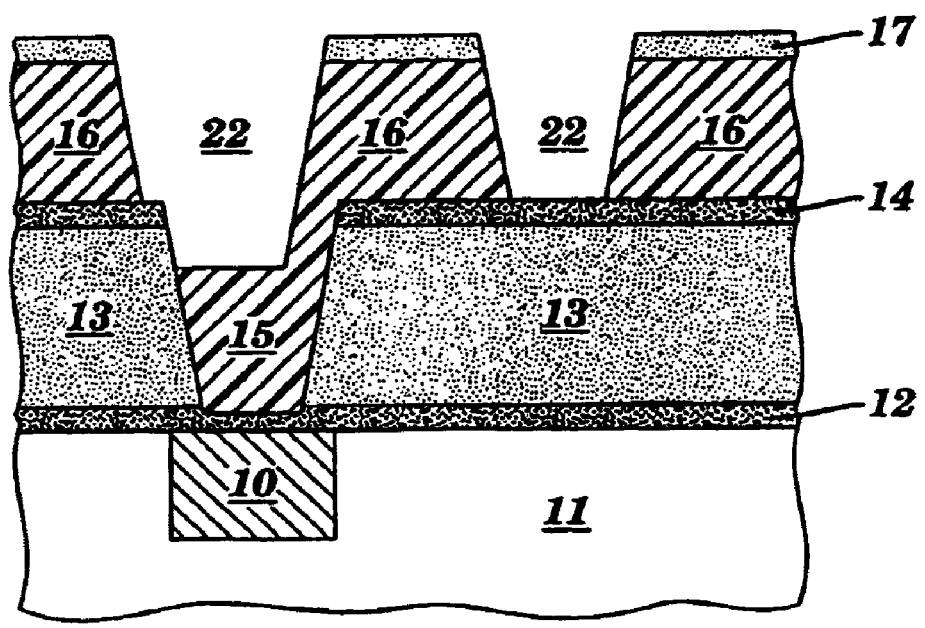

Photoresist or imaging layer 19 is then deposited, exposed and developed, thereby forming trenches 20, as shown in FIG. 1. An anti-reflective coating (ARC) layer 18 may be deposited prior to depositing imaging layer 19. Using the patterned photoresist 19 as a mask, ARC 18 and barrier layer 17 are etched as shown in FIG. 2, resulting in trench openings 21. Then planarizing film 16 is etched, thereby forming trench openings 22, as shown in FIG. 3. During the time that planarizing layer 16 is etched, the imaging layer 19 and ARC layer 18 may be removed by concurrent etching, as layers 19, 18 and 16 are typically organic layers that etch with similar rates in many etch chemistries. The LTO layer 17 acts as a mask for the etching of planarizing layer 16. The result is depicted in FIG. 3. In a preferred embodiment, a mixture of nitrogen and hydrogen may be used to concurrently etch the PHS-based planarizing layer 16, imaging layer 19 and ARC layer 18.

Figure 4:
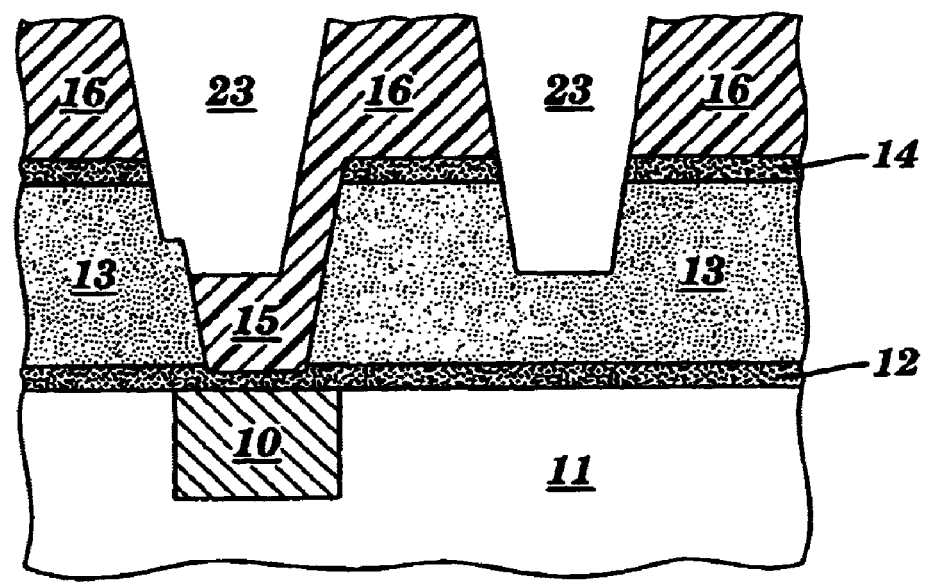
Figure 5:
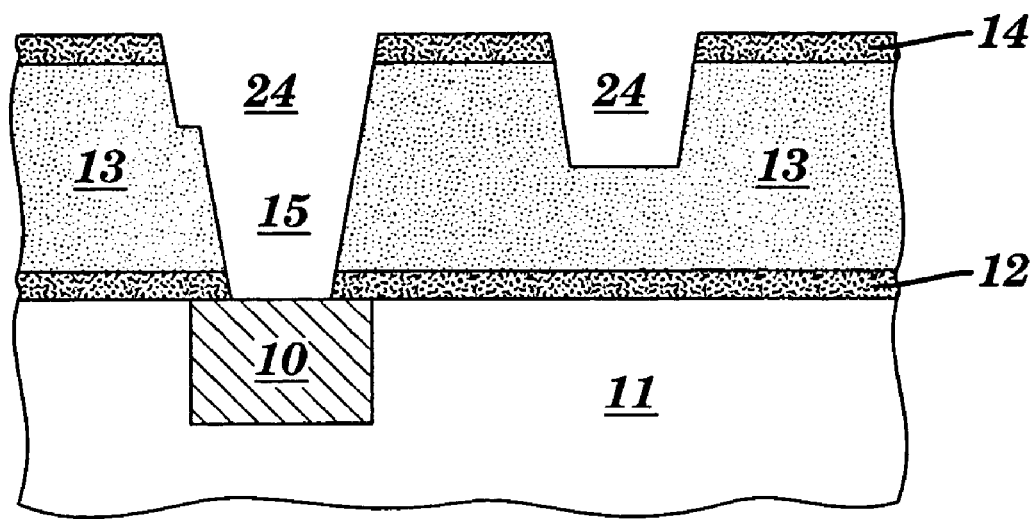

In FIG. 4, ILD 13 is etched using RIE chemistry, thereby forming trenches 22. When ILD 13 is SiCOH, the preferred RIE chemistry is $Ar/O_2/CF_4/CHF_3$ and/or any other fluorocarbon such as $CH_3F$, $CH_2F_2$, $C_2F_6$, $C_4F_8$ and $C_5F_8$. During this RIE step, barrier layer 17 is completely removed, and planarizing layer 16 remains in the field and in the vias. In FIG. 5, planarizing layer 16 is selectively stripped, and cap layer 12 is removed from the bottom of the via 15. When planarizing film 16 is the preferred PHS-based system described above, it may be stripped using, for example, $N_2/H_2/O_2$ chemistry or $O_2/CO$ chemistry or $H_2$ chemistry. Cap layer 12 may be removed using, for example, $Ar/CF_4/O_2$ chemistry or $Ar/CF_4/CHF_3/O_2$ chemistry.

Figure 6:
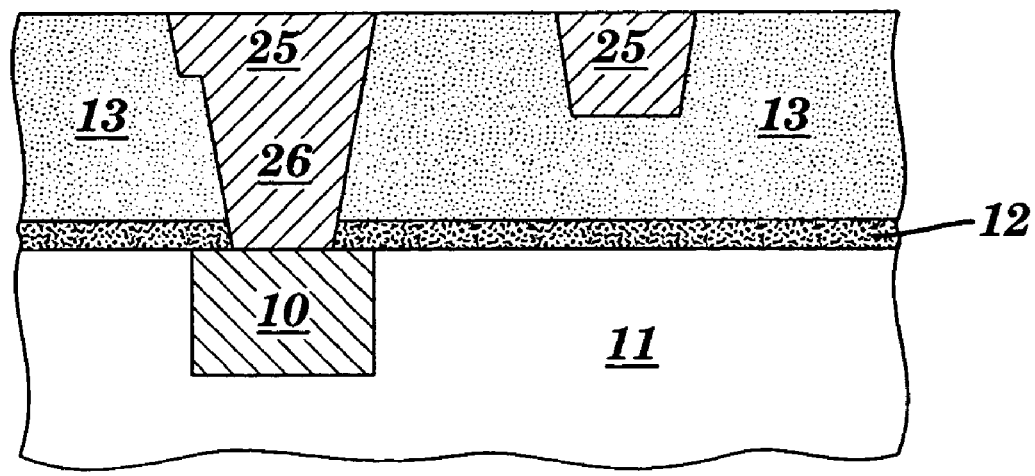

Finally, FIG. 6 depicts the metallization of the dual damascene via/trench patterns, thereby forming lines 25 and via 26. Metallization may be performed by, for example, depositing a thin refractory metal liner and Cu seedlayer by physical vapor deposition (PVD), filling to excess with electroplated Cu, and then planarizing and removing the excess Cu and liner by chemical-mechanical polishing (CMP). During the CMP step, the cap layer 14 may be removed. In some embodiments layer 14 is not completely removed, but is reduced below its original thickness. In a preferred embodiment, layer 14 is completely removed by CMP.

Example: The method herein described was successfully utilized in the production of 90 nm ground rule integrated circuit chips, using the preferred PHS-based system described above as the planarizing layer 16 and LTO as the barrier layer 17. The cap layer 12 above underlying Cu conductors 10 was SiCNH, and no post-treatments or covering layers were used so as to prevent amine formation from this layer. Some chips were fabricated with via resist strip etch chemistries that included $N_2$ and $H_2$, with no cleaning step after this strip. This would tend to form amines after subsequent 225° C. bake of the planarizing layer. The absence of resist poisoning was verified through optical and SEM inspection and through electrical test data. It is known that certain structures on the chip are particularly sensitive to resist poisoning, such as isolated vias and the corners of via chain array test structures. All test structures were shown to be completely free of any resist poisoning effects.

With the method of this invention, photoresist poisoning is eliminated, and yet conventional lithographic photoresists may be used with no special additives or procedures. This method allows for a wide lithography process window, since the wafer is completely planarized. In other words, there is no need to print vias inside troughs, and no need to print over steps created by hardmasks. Moreover, this method uses conventional RIE gases. No metal hardmask is involved, thus the method is compatible with existing back-end-of-line (BEOL) RIE processes typically used in semiconductor production, and it does not involve new learning of RIE manufacturing techniques associated with metal hardmask. There is also no constraint on nitrogen content of underlying dielectric layers, including Cu barrier caps and the interlevel dielectric itself. The via-first method is inherently simpler for RIE as compared to the multiple hard mask method, because the via etch can be adjusted without affecting trench etch. Most importantly, this method is extendable to future technologies, as new materials are introduced with increased porosity and deceased physical linewidths.

In the preferred embodiment described above, the method of this invention is illustrated in the context of a via-first dual damascene approach. The method, however, is equally applicable to other damascene techniques such as a line-first dual damascene approach.

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

The invention claimed is:

1. A method for forming an etched pattern on a semiconductor substrate, the method comprising the steps of:
   depositing a thin film on the substrate;
   depositing a layer of planarizing material on the thin film;
   depositing a layer of barrier material that substantially blocks impurity diffusion from an underlying interlevel dielectric into an imaging material on the layer of planarizing material;
   depositing a layer of anti-reflective coating on the layer of barrier material;
   depositing at least one layer of imaging material on the layer of barrier material;
   forming at least one first pattern shape in the layers of imaging material, barrier material, anti-reflective coating and planarizing material;
   removing the imaging material, either after or concurrently with forming the first pattern shape in the planarizing material;
   removing the anti-reflective coating, either after or concurrently with forming the first pattern shape in the planarizing material; and
   transferring the first pattern shape to the thin film.

2. The method of claim 1, wherein at least one second pattern shape is formed in the thin film prior to depositing the layer of planarizing material, and the second pattern shape is filled by the planarizing material.

3. The method of claim 1, wherein the thin film is a dielectric material.

4. The method of claim 3, wherein the thin film is a low-k dielectric material.

5. The method of claim 3, wherein the low-k dielectric material has a dielectric constant less than 3.9.

6. The method of claim 3, wherein the low-k dielectric material has a dielectric constant less than about 3.2.

7. The method of claim 1, wherein the planarizing material is a poly(hydroxystyrene)-based system comprising poly(4-hydroxystyrene), 9-anthracenylmethylated poly(hydroxystyrene), tetrahydro-1,3,4,6-tetrakis(methoxymethyl)-imidazo[4,5-d]imidazole-2,5-(1H,3H)-dione, and p-nitrobenzyl tosylate (pNBT).

8. The method of claim 1, wherein the planarizing material is selected from the group consisting of polyarylsulfones, polyhydroxystyrene-based derivatives, polyimides, polyethers, polyarylenesulfides, polycarbonates, epoxies, epoxyacrylates, polyarylenes, polyarylenevinylenes, polyvinylcarbazole, cyclicolefins, and polyesters.

9. The method of claim 1, wherein the barrier material comprises silicon dioxide deposited by plasma-enhanced chemical vapor deposition at a temperature of about 100° C. to about 225° C.

10. The method of claim 9, wherein the barrier material is deposited by plasma-enhanced chemical vapor deposition at a temperature of about 150° C.

11. The method of claim 1, wherein the barrier material comprises a material selected from the group consisting of silicon, silicon nitride, silicon carbide, titanium nitride, and tantalum nitride.

12. The method of claim 1, further comprising the step of filling the first pattern shape with a conductive material, after removing the imaging material, the barrier material, the anti-reflective coating, and the planarizing material.

13. The method of claim 12, wherein the conductive material comprises copper.

14. A method for forming a dual damascene interconnect structure on a semiconductor substrate comprising at least one patterned conductor, the method comprising the steps of:
depositing a dielectric material on the substrate;
forming at least one via in said dielectric material, such that at least one of the vias is positioned over the patterned conductor;
depositing a layer of planarizing material on the dielectric material and in the via;
depositing a layer of barrier material that substantially blocks impurity diffusion from the dielectric material into an imaging material on the layer of planarizing material;
depositing a layer of anti-reflective coating on said barrier material;
depositing at least one layer of imaging material on the layer of barrier material;
forming at least one trench in the layers of imaging material, anti-reflective coating, barrier material and planarizing material, such that at least one of the trenches is positioned over the via;
removing the imaging material, either after or concurrently with forming the trench in the planarizing material;
removing the anti-reflective coating, either after or concurrently with forming the trench in the planarizing material; and
transferring the at least one trench to the dielectric material, such that at least one of the trenches is positioned over the via.

15. The method of claim 14, wherein the dielectric material is a low-k dielectric material.

16. The method of claim 15, wherein the low-k dielectric material has a dielectric constant less than 3.9.

17. The method of claim 15, wherein the low-k dielectric material has a dielectric constant less than about 3.2.

18. The method of claim 15, wherein the low-k dielectric material is SiCOH deposited by chemical vapor deposition.

19. The method of claim 14, wherein the planarizing material is a poly(hydroxystyrene)-based system comprising poly(4-hydroxystyrene), 9-anthracenylmethylated poly(hydroxystyrene), tetrahydro-1,3,4,6-tetrakis(methoxymethyl)-imidazo[4,5-d]imidazole-2,5-(1H,3H)-dione, and p-nitrobenzyl tosylate (pNBT).

20. The method of claim 19, further comprising the step of baking the planarizing material at a temperature of about 200° C. to about 250° C., after deposition of the planarizing material.

21. The method of claim 19, further comprising the step of baking the planarizing material at a temperature of about 225° C., after deposition of the planarizing material.

22. The method of claim 14, wherein the planarizing material is selected from the group consisting of polyarylsulfones, polyhydroxystyrene-based derivatives, polyimides, polyethers, polyarylenesulfides, polycarbonates, epoxies, epoxyacrylates, polyarylenes, polyarylenevinylenes, polyvinylcarbazole, cyclicolefins, and polyesters.

23. The method of claim 14, wherein the barrier material is silicon dioxide.

24. The method of claim 23, wherein the barrier material is deposited by plasma-enhanced chemical vapor deposition at a temperature of about 100° C. to about 225° C.

25. The method of claim 23, wherein the barrier material is deposited by plasma-enhanced chemical vapor deposition at a temperature of about 150° C.

26. The method of claim 14, wherein the barrier material comprises a material selected from the group consisting of silicon, silicon nitride, silicon carbide, titanium nitride, and tantalum nitride.

27. The method of claim 14, further comprising the step of filling the via and the trench with a conductive material, after removing the imaging material, the anti-reflective coating, the barrier material and the planarizing material.

28. The method of claim 27, wherein the conductive material comprises copper.

29. The method of claim 14, wherein the at least one via has a height, and the layer of planarizing material has a thickness of about half the via height to about twice the via height.

30. The method of claim 14, wherein the layer of barrier material has a thickness of about 50 to 100 nm.

31. A method for forming a dual damascene interconnect structure on a semiconductor substrate comprising at least one patterned conductor, the method comprising the steps of:
depositing a dielectric material on the substrate;
forming at least one trench in the dielectric material, such that at least one of the trenches is positioned over the patterned conductor;
depositing a layer of planarizing material on the dielectric material and in the trench;
depositing a layer of barrier material that substantially blocks impurity diffusion from an underlying interlevel dielectric into an imaging material on the layer of planarizing material;
depositing a layer of anti-reflective coating on said barrier material;
depositing at least one layer of imaging material on the layer of barrier material;

forming at least one via in the layers of imaging material, barrier material and planarizing material, such that at least one of the vias is positioned over the trench and the patterned conductor;

removing the imaging material, either after or concurrently with forming the via in the planarizing material; and transferring the at least one via to the dielectric material, such that at least one of the vias is positioned over the trench and the patterned conductor;

removing the barrier material, either after or concurrently with transferring the at least one via to the dielectric material;

removing the anti-reflective coating, either after or concurrently with forming the via in the planarizing material; and, removing the planarizing material.

32. The method of claim 31, wherein the dielectric material is a low-k dielectric material.

33. The method of claim 32, wherein the low-k dielectric material has a dielectric constant less than 3.9.

34. The method of claim 32, wherein the low-k dielectric material has a dielectric constant less than about 3.2.

35. The method of claim 32, wherein the low-k dielectric material is SiCOH deposited by chemical vapor deposition.

36. The method of claim 31, wherein the planarizing material is a poly(hydroxystyrene)-based system comprising poly(4-hydroxystyrene), 9-anthracenylmethylated poly(hydroxystyrene), tetrahydro-1,3,4,6-tetrakis(methoxymethyl)-imidazo[4,5-d]imidazole-2,5-(1H,3H)-dione, and p-nitrobenzyl tosylate (pNBT).

37. The method of claim 36, further comprising the step of baking the planarizing material at a temperature of about 200° C. to about 250° C., after deposition of the planarizing material.

38. The method of claim 31, further comprising the step of baking the planarizing material at a temperature of about 225° C., after deposition of the planarizing material.

39. The method of claim 31, wherein the planarizing material is selected from the group consisting of polyarylsulfones, polyhydroxystyrene-based derivatives, polyimides, polyethers, polyarylenesulfides, polycarbonates, epoxies, epoxyacrylates, polyarylenes, polyarylenevinylenes, polyvinylcarbazole, cyclicolefins, and polyesters.

40. The method of claim 31, wherein the barrier material is silicon dioxide.

41. The method of claim 40, wherein the barrier material is deposited by plasma-enhanced chemical vapor deposition at a temperature of about 100° C. to about 225° C.

42. The method of claim 40, wherein the barrier material is deposited by plasma-enhanced chemical vapor deposition at a temperature of about 150° C.

43. The method of claim 31, wherein the barrier material comprises a material selected from the group consisting of silicon, silicon nitride, silicon carbide, titanium nitride, and tantalum nitride.

44. The method of claim 31, further comprising the step of filling the via and the trench with a conductive material, after removing the imaging material, the anti-reflective coating, the barrier material and the planarizing material.

45. The method of claim 44, wherein the conductive material comprises copper.

46. The method of claim 31, wherein the layer of barrier material has a thickness of about 50 to 100 nm.

47. The method of claim 1, further comprising the steps of:

removing the barrier layer, either after or concurrently with transferring the first pattern shape to the thin film; and removing the planarizing material.

48. The method of claim 14, further comprising the steps of:

removing the barrier material, either after or concurrently with transferring the at least one trench to the dielectric material; and removing the planarizing material.

49. A method for forming an etched pattern on a semiconductor substrate, the method comprising the steps of:

depositing a thin film on the substrate;

depositing a layer of planarizing material on the thin film;

depositing a barrier material of silicon dioxide on the layer of planarizing material;

depositing at least one layer of imaging material on the silicon dioxide;

forming at least one first pattern shape in the layers of imaging material, silicon dioxide and planarizing material;

removing the imaging material, either after or concurrently with forming the first pattern shape in the planarizing material; and transferring the first pattern shape to the thin film.

50. The method of claim 49, wherein at least one second pattern shape is formed in the thin film prior to depositing the layer of planarizing material, and the second pattern shape is filled by the planarizing material.

51. The method of claim 49, wherein the thin film is a dielectric material.

52. The method of claim 51, wherein the thin film is a low-k dielectric material.

53. The method of claim 51, wherein the low-k dielectric material has a dielectric constant less than 3.9.

54. The method of claim 51, wherein the low-k dielectric material has a dielectric constant less than about 3.2.

55. The method of claim 49, wherein the planarizing material is a poly(hydroxystyrene)-based system comprising poly(4-hydroxystyrene), 9-anthracenylmethylated poly(hydroxystyrene), tetrahydro-1,3,4,6-tetrakis(methoxymethyl)-imidazo[4,5-d]imidazole-2,5-(1H,3H)-dione, and p-nitrobenzyl tosylate (pNBT).

56. The method of claim 49, wherein the planarizing material is selected from the group consisting of polyarylsulfones, polyhydroxystyrene-based derivatives, polyimides, polyethers, polyarylenesulfides, polycarbonates, epoxies, epoxyacrylates, polyarylenes, polyarylenevinylenes, polyvinylcarbazole, cyclicolefins, and polyesters.

57. The method of claim 49, wherein the silicon dioxide is deposited by plasma-enhanced chemical vapor deposition at a temperature of about 100° C. to about 225° C.

58. The method of claim 57, wherein the silicon dioxide is deposited by plasma-enhanced chemical vapor deposition at a temperature of about 150° C.

59. The method of claim 49, further comprising the steps of:

depositing a layer of anti-reflective coating on the silicon dioxide, prior to depositing the layer of imaging material; and removing the anti-reflective coating, either after or concurrently with forming the first pattern shape in the planarizing material.

60. The method of claim 49, further comprising the step of filling the first pattern shape with a conductive material, after removing the imaging material, the silicon dioxide and the planarizing material.

61. The method of claim 61, wherein the conductive material comprises copper.

62. The method of claim 49, further comprising the steps of:
removing the silicon dioxide, either after or concurrently with transferring the first pattern shape to the thin film; and
removing the planarizing material.

63. A method for forming a dual damascene interconnect structure on a semiconductor substrate comprising at least one patterned conductor, the method comprising the steps of:
depositing a dielectric material on the substrate;
forming at least one via in said dielectric material, such that at least one of the vias is positioned over the patterned conductor;
depositing a layer of planarizing material on the dielectric material and in the via;
depositing a barrier material of silicon dioxide on the layer of planarizing material;
depositing at least one layer of imaging material on the silicon dioxide;
forming at least one trench in the layers of imaging material, silicon dioxide and planarizing material, such that at least one of the trenches is positioned over the via;
removing the imaging material, either after or concurrently with forming the trench in the planarizing material; and
transferring the at least one trench to the dielectric material, such that at least one of the trenches is positioned over the via.

64. The method of claim 63, wherein the dielectric material is a low-k dielectric material.

65. The method of claim 64, wherein the low-k dielectric material has a dielectric constant less than 3.9.

66. The method of claim 64, wherein the low-k dielectric material has a dielectric constant less than about 3.2.

67. The method of claim 64, wherein the low-k dielectric material is SiCOH deposited by chemical vapor deposition.

68. The method of claim 63, wherein the planarizing material is a poly(hydroxystyrene)-based system comprising poly(4-hydroxystyrene), 9-anthracenylmethylated poly(hydroxystyrene), tetrahydro-1,3,4,6-tetrakis(methoxymethyl)-imidazo[4,5-d]imidazole-2,5-(1H,3H)-dione, and p-nitrobenzyl tosylate (pNBT).

69. The method of claim 68, further comprising the step of baking the planarizing material at a temperature of about 200° C. to about 250° C., after deposition of the planarizing material.

70. The method of claim 68, further comprising the step of baking the planarizing material at a temperature of about 225° C., after deposition of the planarizing material.

71. The method of claim 63, wherein the planarizing material is selected from the group consisting of polyarylsulfones, polyhydroxystyrene-based derivatives, polyimides, polyethers, polyarylenesulfides, polycarbonates, epoxies, epoxyacrylates, polyarylenes, polyarylenevinylenes, polyvinylcarbazole, cyclicolefins, and polyesters.

72. The method of claim 63, wherein the silicon dioxide is deposited by plasma-enhanced chemical vapor deposition at a temperature of about 100° C. to about 225° C.

73. The method of claim 63, wherein the silicon dioxide is deposited by plasma-enhanced chemical vapor deposition at a temperature of about 150° C.

74. The method of claim 63, further comprising the steps of:
depositing a layer of anti-reflective coating on the silicon dioxide, prior to deposition of the layer of imaging material; and
removing the anti-reflective coating, either after or concurrently with forming the trench in the planarizing material.

75. The method of claim 63, further comprising the step of filling the via and the trench with a conductive material, after removing the imaging material, the silicon dioxide, and the planarizing material.

76. The method of claim 75, wherein the conductive material comprises copper.

77. The method of claim 63, wherein the at least one via has a height, and the layer of planarizing material has a thickness of about half the via height to about twice the via height.

78. The method of claim 63, wherein the silicon dioxide has a thickness of about 50 to 100 nm.

79. The method of claim 63, further comprising the steps of:
removing the silicon dioxide, either after or concurrently with transferring the at least one trench to the dielectric material; and
removing the planarizing material.

80. A method for forming a dual damascene interconnect structure on a semiconductor substrate comprising at least one patterned conductor, the method comprising the steps of:
depositing a dielectric material on the substrate;
forming at least one trench in the dielectric material, such that at least one of the trenches is positioned over the patterned conductor;
depositing a layer of planarizing material on the dielectric material and in the trench;
depositing a barrier material of silicon dioxide on the layer of planarizing material;
depositing a layer of anti-reflective coating on said barrier material;
depositing at least one layer of imaging material on the layer of barrier material;
forming at least one via in the layers of imaging material, barrier material and planarizing material, such that at least one of the vias is positioned over the trench and the patterned conductor;
removing the imaging material, either after or concurrently with forming the via in the planarizing material; and
transferring the at least one via to the dielectric material, such that at least one of the vias is positioned over the trench and the patterned conductor;
removing the barrier material, either after or concurrently with transferring the at least one via to the dielectric material; and
removing the planarizing material.

81. The method of claim 80, wherein the dielectric material is a low-k dielectric material.

82. The method of claim 81, wherein the low-k dielectric material has a dielectric constant less than 3.9.

83. The method of claim 81, wherein the low-k dielectric material has a dielectric constant less than about 3.2.

84. The method of claim 81, wherein the low-k dielectric material is SiCOH deposited by chemical vapor deposition.

85. The method of claim 80, wherein the planarizing material is a poly(hydroxystyrene)-based system comprising poly(4-hydroxystyrene), 9-anthracenylmethylated poly(hydroxystyrene), tetrahydro-1,3,4,6-tetrakis(methoxymethyl)-imidazo[4,5-d]imidazole-2,5-(1H,3H)-dione, and p-nitrobenzyl tosylate (pNBT).

86. The method of claim 85, further comprising the step of baking the planarizing material at a temperature of about 200° C. to about 250° C., after deposition of the planarizing material.

87. The method of claim 85, further comprising the step of baking the planarizing material at a temperature of about 225° C., after deposition of the plananzing material.

88. The method of claim 80, wherein the planarizing material is selected from the group consisting of polyarylsulfones, polyhydroxystyrene-based derivatives, polyimides, polyethers, polyarylenesulfides, polycarbonates, epoxies, epoxyacrylates, polyarylenes, polyarylenevinylenes, polyvinylcarbazole, cyclicolefins, and polyesters.

89. The method of claim 80, wherein the barrier material is deposited by plasma-enhanced chemical vapor deposition at a temperature of about 100° C. to about 225° C.

90. The method of claim 80, wherein the barrier material is deposited by plasma-enhanced chemical vapor deposition at a temperature of about 150° C.

91. The method of claim 80, further comprising the steps of:
depositing a layer of anti-reflective coating on the barrier material, prior to depositing the layer of imaging material; and
removing the anti-reflective coating, either after or concurrently with forming the via in the planarizing material.

92. The method of claim 80, further comprising the step of filling the via and the trench with a conductive material, after removing the imaging material, the barrier material and the planarizing material.

93. The method of claim 92, wherein the conductive material comprises copper.

94. The method of claim 80, wherein the layer of barrier material has a thickness of about 50 to 100 nm.

* * * * *